(12) United States Patent
Iyengar et al.

(10) Patent No.: US 7,969,736 B1
(45) Date of Patent: Jun. 28, 2011

(54) SYSTEM FOR COOLING MEMORY MODULES

(75) Inventors: Madhusudan K. Iyengar, Woodstock, NY (US); Vinod Kamath, Raleigh, NC (US); Howard V. Mahaney, Jr., Cedar Park, TX (US); Jason A. Matteson, Raleigh, NC (US); Mark E. Steinke, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/701,640

(22) Filed: Feb. 8, 2010

(51) Int. Cl.
*H05K 7/20* (2006.01)

(52) U.S. Cl. ........ 361/699; 361/700; 361/709; 361/715; 361/716; 174/15.1; 174/15.2; 165/80.4; 165/104.33

(58) Field of Classification Search .......... None
See application file for complete search history.

(56) References Cited

U.S. PATENT DOCUMENTS

| | | | |
|---|---|---|---|
| 4,115,836 A | 9/1978 | Hutchinson et al. | |
| 4,186,422 A | 1/1980 | Laermer | |
| 6,025,992 A | 2/2000 | Dodge et al. | |
| 7,023,701 B2 | 4/2006 | Stocken et al. | |
| 7,106,595 B2* | 9/2006 | Foster et al. | 361/721 |
| 7,151,668 B1 | 12/2006 | Stathakis | |
| 7,286,355 B2* | 10/2007 | Cheon | 361/699 |
| 7,342,797 B2 | 3/2008 | Kamath et al. | |
| 7,405,936 B1* | 7/2008 | Campbell et al. | 361/699 |
| 7,755,897 B2* | 7/2010 | Chen et al. | 361/707 |
| 2008/0062652 A1* | 3/2008 | Lieberman et al. | 361/715 |
| 2008/0251911 A1 | 10/2008 | Farnsworth et al. | |
| 2009/0277616 A1 | 11/2009 | Cipolla et al. | |
| 2010/0025010 A1* | 2/2010 | Cipolla et al. | 165/47 |
| 2010/0085712 A1* | 4/2010 | Hrehor et al. | 361/699 |
| 2010/0328891 A1* | 12/2010 | Campbell et al. | 361/700 |

OTHER PUBLICATIONS

Softpedia, "First Water Cooled memory Module", http: //news.softpedia.com/news/First-Water-Cooled_Cooled_Memory_module_40583.shtml, Jan. 19, 2010, 3 pages.
IPCOM000137893D "Method for low-cost memory cooling", IP.COM, Jun. 29, 2006, 7 pages.
IPCOM000168297D "DIMM Array Liquid Cooling Structure With FRU-ability Features", IP.COM, Mar. 5, 2008, 3 pages.

* cited by examiner

*Primary Examiner* — Boris L Chervinsky
(74) *Attorney, Agent, or Firm* — Cynthia G. Seal; Jeffrey L. Streets

(57) ABSTRACT

DIMMs are cooled by positioning a thermally conductive base between adjacent DIMMs. The thermally conductive base, such as a heat pipe or metal rod, receives heat from the DIMMs through thermally conductive elements that are selectively biased outward against the installed DIMMs. The base transfers the heat to a liquid conduit extending along the end of the DIMMs, where a circulating liquid carries away the heat. The thermally conductive elements provide an adjustable span to accommodate variations in distance between the DIMM surfaces. Embodiments of the invention may be installed without extending above the height of the DIMM.

18 Claims, 4 Drawing Sheets

SYSTEM FOR COOLING MEMORY MODULES

BACKGROUND

1. Field of the Invention

The present invention relates to systems and methods for using liquid to cool memory modules.

2. Background of the Related Art

Computer systems are being designed and built with an ever increasing number of heat generating components. Given the limited footprint of most computing systems, a continuous increase in the number of heat generating components creates challenging heat dissipation issues. These issues if not dealt with adequately can harm the structural and data integrity of the computer system, making the effect felt both at a system and component level.

Most electronic packages or nodes in large computer environments are housed in chassis disposed in racks. Traditionally, these nodes have been cooled by forced air cooling using air moving devices, such as fans and blowers, selectively disposed somewhere in the environment as to allow optimum air flow. These air moving devices are often designed to displace hot air away from the components by creating parallel air flow paths that circulate through the chassis and rack. Air moving systems may take the form of a computer room air conditioning (CRAC) system, a chassis fan system, or fans in an individual node or group of nodes.

As the density of heat generating components increases, air cooling solutions are becoming more prohibitive and costly. In recent years, attention has been directed to cooling high heat flux microprocessor modules. However, with an increase in bandwidth and server throughput, large amounts of on-board memory are also required to achieve increased performance. In order to provide this increase in the amount of memory in servers, any given system has experienced an increase in the number of standard memory packages, such as dual in-line memory modules (hereinafter DIMMs). In addition, each memory package often has increasing power consumption, increasing heat generation and tighter DIMM row spacing associated with it. Memory modules can contribute as much as 50% of the total server heat load. If the maximum DIMM temperature dictated by reliability is unchanged, then traditional air cooled servers will require greater airflow in order to achieve increased heat removal.

In recent years, direct or indirect liquid cooling has become a more attractive option for the designers of computing systems. Liquid cooled structures have been shown, in some circumstances such as large data centers, to consume less energy. The systems currently in use, however, whether air cooled or water cooled, provide limited options. It is a concern that current cooling methods and system may not be suitable to adequately cool future generations of computer systems or subsystems, especially when it comes to cooling memory packages such as DIMMs.

BRIEF SUMMARY

One embodiment of the present invention provides an apparatus for cooling first and second adjacent DIMMs, wherein the apparatus comprises a liquid conduit, a thermally conductive base, and first and second thermally conductive elements. The liquid conduit extends along at least one end of the first and second adjacent DIMMs, and the liquid conduit is adapted for circulating a cooling liquid. The thermally conductive base extends along a gap between the first DIMM and the adjacent second DIMM, and the thermally conductive base has an end in thermal communication with the liquid conduit. The geometry of the thermally conductive base, which may be a heat pipe, can be round, square or some other cross section shape that fits the available space. The first thermally conductive element provides thermal conduction from a surface of the first DIMM to the base and the second thermally conductive element provides thermal conduction from a surface of the second DIMM to the base. The first and second thermally conductive elements also provide an adjustable span to accommodate variations in distance between the surface of the first DIMM and the surface of the second DIMM.

Another embodiment of the invention provides a method of cooling a DIMM installed in a computer system, comprising: circulating liquid through a liquid conduit that extends along one edge of a region containing a plurality of DIMMs; positioning a heat pipe between adjacent DIMMs, wherein the heat pipe has an end that extends beyond the DIMMs into thermal contact with the liquid conduit; and biasing first and second thermally conductive elements into thermal contact with the adjacent DIMMs, wherein the first and second thermally conductive elements are in thermal contact with the heat pipe so that heat is transferred from the adjacent DIMMs through the first and second thermally conductive element to the heat pipe, from the heat pipe to the liquid conduit, and removed with the circulating liquid.

DETAILED DESCRIPTION

Figure 1A:
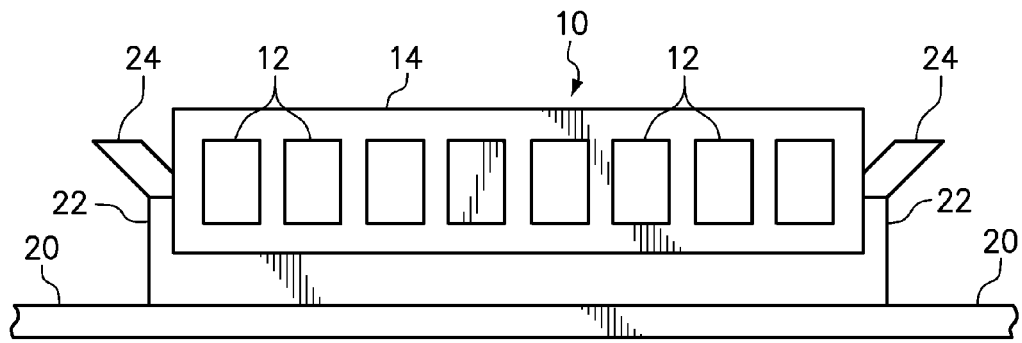
FIG. 1A is a side view of a DIMM installed in a connector on a motherboard.

One embodiment of the present invention provides an apparatus for cooling first and second adjacent DIMMs, wherein the apparatus comprises a liquid conduit, a thermally conductive base, and first and second thermally conductive elements. The liquid conduit extends along at least one end of the first and second adjacent DIMMs, and the liquid conduit is adapted for circulating a cooling liquid. The thermally conductive base extends along a gap between the first DIMM and the adjacent second DIMM, and the thermally conductive base has an end in thermal communication with the liquid conduit. The first thermally conductive element provides thermal conduction from a surface of the first DIMM to the thermally conductive base and the second thermally conductive element provides thermal conduction from a surface of the second DIMM to the thermally conductive base. The first and second thermally conductive elements also provide an adjustable span to accommodate variations in distance between the surface of the first DIMM and the surface of the second DIMM.

The liquid conduit serves as a thermal bus to remove heat from the system. The liquid circulated through the liquid conduit may be various pure liquids or liquid solutions, but the liquid is preferably water. Unchilled water from a building water supply may be utilized to eliminate the cost of chilling the water. The conduit should be thermally conductive. The conductivity of the conduit is preferably high, such as with copper and aluminum, but may be lower, such as with other metals or composite materials, although there is no specific minimum value of thermal conductivity required of the conduit. However, the thermal conductivity of the conduit is particularly important in regions where the conduit makes contact with thermally conductive bases delivering heat from the DIMMs. Accordingly, the conduit is preferably made from a metal such as copper, aluminum or stainless steel. The conduit may extend along a single end of the DIMMs, along both ends of the DIMMs, or along any path that provides convenience cooling to one or more thermally conductive bases. Where the computer system include an array of DIMM configured in multiple rows and multiple columns, the conduit may establish an inlet manifold and an outlet manifold with a multiple branches between the columns for thermal contact with multiple thermally conductive bases. The thermally conductive base connection to the fluid conduit can take a variety of forms. The end of the thermally conductive base can be round and have a machined round groove to mate. Another method for attachment could be to flatten the end of the base to sandwich into the liquid conduits. The attachment to the liquid conduit can be made in the plane parallel to the board or even perpendicular to be board that houses the DIMM connectors.

The thermally conductive base, for example a heat pipe, extends along a gap between the first DIMM and the adjacent second DIMM, so that the heat pipe runs generally parallel to the first and second DIMM. The heat pipe preferably extends along the full length of the DIMM so that the each of the DRAM chips is cooled. One or both ends of the heat pipe may extend beyond the end of the DIMMs in order to make thermal contact with the liquid conduit. It should be understood that a heat pipe is made with a thermally conductive material, such as metal, and contains its own internal fluid to transfer heat within the heat pipe chamber through phase transitions (i.e., evaporation at hot surfaces and condensation at cool surfaces). Accordingly, there is no fluid communication between the heat pipe and the liquid conduit. Rather, heat is conductively transferred from the outer surface of the heat pipe to the liquid conduit. In an optional embodiment, the apparatus comprises first and second heat pipes, such as two semi-circular heat pipes, that both extend along the gap between first and second DIMMs, and both have an end in thermal communication with the liquid conduit. According to this optional embodiment, if there is a malfunction in a first heat pipe then there is a second heat pipe in place to maintain the necessary heat transfer.

As stated above, the first thermally conductive element provides thermal conduction from a surface of the first DIMM to the heat pipe and the second thermally conductive element provides thermal conduction from a surface of the second DIMM to the heat pipe. The conductive elements preferably include a metal, such as copper or aluminum, but may also include other materials for direct interface with the DIMM, such as thermally conductive and elastically compressive thermal interface pad. Suitable materials for the thermal interface pad include, for example, T-PUTTY (available from Laird Technologies, Inc.), TP-2100 thermal pad (available from Dow Corning Corporation of Midland, Mich.), and SIL-PAD 900S (available from The Bergquist Company of Chanhassen, Minn.). In one embodiment, the first and second elements are two legs of a U-shaped structure that receives the heat pipe therein. In an alternative embodiment, the first and second elements are connected to a sleeve that is received about the heat pipe. In either of these embodiments, heat from the surfaces of the first and second DIMMs is thermally conducted through the first and second elements to the heat pipe.

The structure that forms the first and second elements should contact the heat pipe over a significant surface area of the heat pipe in order to provide a high rate of heat transfer there between. Furthermore, the first and second thermally conductive elements will preferably not extend above, or at least not significantly extend above, the height of the first and second DIMMs so that the elements are compatible with physically constrained enclosures that contain the DIMMs, such as a 1 U server enclosure. In a further embodiment, the first and second elements each have a flat face that contacts a flat face of the first and second DIMMs when the first and second elements are in their laterally flexed position.

The first and second thermally conductive elements also provide an adjustable span to accommodate variations in distance between the surface of the first DIMM and the surface of the second DIMM. For example, the thickness of the dual-sided DIMMs may vary from one DIMM to the next, thereby leaving a gap between the DIMMs that has a gap width that may vary. In one embodiment, the first and second elements are designed to avoid interfering with installation of the DIMM as well as flex to provide good contact with the DIMM despite variations in the width of the gap. In an alternative embodiment, any variation in the width of the gap is accommodated by elastically compressible thermal interface pad that extends from the first and second elements into contact with the DIMMs.

In a further embodiment, the apparatus further comprises a wedge that is selectively positionable between the first and second elements to bias the first element to flex laterally into thermal communication with the first DIMM and simultaneously bias the second element to flex laterally into thermal communication with the second DIMM. In order to avoid interference with the DIMM installation, the first and second elements preferably have a retracted position where the elements are relaxed (i.e., not flexed). The wedge has a first end that fits between the first and second elements in their retracted positions, and one or more inclined surfaces that flex the first and second elements outward into engagement with the surface of the DIMM as the wedge is advanced downward to a fully inserted position between the first and second elements. In a first optional sub-embodiment, the wedge may include a latch for securing the wedge in the fully inserted position. In a further optional sub-embodiment, the apparatus may include a spring disposed between first and second elements to outwardly displace the wedge from the fully inserted position when the latch is released. The optional latch and spring may operate collectively in order to avoid the need for a handle extending from the wedge above the DIMM.

In a still further embodiment, the first thermally conductive element includes an elastically compressible and thermally conductive interface material disposed for contact with the first DIMM, and the second thermally conductive element includes an elastically compressible and thermally conductive interface material disposed for contact with the second DIMM. Such an elastically compressible and thermally conductive interface material may be utilized whether or not the first and second elements are stationary or flexible. In embodiments using stationary elements, the first interface material is preferably elastically compressible to extend between the first element and the first DIMM over a range of distances, and the second interface material is preferably elastically compressible to extend between the first element and the first DIMM over a range of distances.

Another embodiment of the invention provides a method of cooling a DIMM installed in a computer system. The method comprises circulating liquid through a liquid conduit that extends along one edge of a region containing a plurality of DIMMs; positioning a heat pipe between adjacent DIMMs, wherein the heat pipe has an end that extends beyond the DIMMs into thermal contact with the liquid conduit; and biasing first and second thermally conductive elements into thermal contact with the adjacent DIMMs, wherein the first and second thermally conductive elements are in thermal contact with the heat pipe so that heat is transferred from the adjacent DIMMs through the first and second thermally conductive element to the heat pipe, from the heat pipe to the liquid conduit, and removed with the circulating liquid. The liquid is preferably water, and may be chilled or unchilled water, such as water directly from a building water supply, depending at least in part upon DIMM power, water flowrate and possibly other system variables.

In one sub-embodiment of the method, the step of biasing the first and second thermally conductive elements into thermal contact with the adjacent DIMMs includes inserting a wedge between the first and second thermally conductive elements. An optional latch may be used to selectively retain the wedge in a fully inserted position. Optionally, the wedge may have two or more latching positions that correspond to a fully inserted position for any two or more DIMM width, since wider DIMMs require less insertion of the wedge in order to achieve full thermal contact between the DIMMS and the thermally conductive elements. In an alternative sub-embodiment, the step of biasing the first and second thermally conductive elements into thermal contact with the adjacent DIMMs includes expanding a first elastically compressible and thermally conductive interface material between the first thermally conductive element and a first DIMM, and expanding a second elastically compressible and thermally conductive interface material between the second thermally conductive element and a second DIMM.

FIG. 1A is a side view of a DIMM 10 installed in a connector 22 on a motherboard 20. A latch 24 at each end of the connector 22 may be manually depressed downward to release and eject the DIMM 10. The DIMM 10 carries a plurality of DRAM chips 12, which may be secured on one or both sides of a circuit board 14.

Figure 1B:
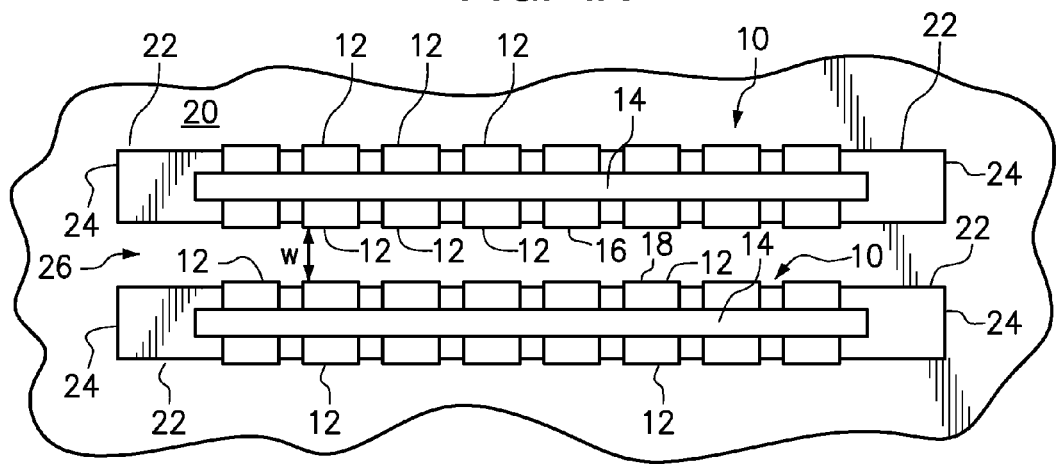
FIG. 1B is a top view of two DIMMs installed in adjacent connectors on a motherboard.

FIG. 1B is a top view of two DIMMs 10 installed in adjacent connectors 22 on the motherboard 20. Each DIMM 10 is a doubled-sided DIMM having DRAM chips 12 on both sides of a circuit board 14. The DIMM 10 is shown as having a width approximately the same as the width of the connector 22, but various DIMM may have other greater or lesser widths. However, surface 16 of a first DIMM and surface 18 of a second DIMM define a gap 26 there between. The width "W" of the gap 26 is generally well-defined to provide adequate forced air cooling of the DIMM when the DIMM are aligned with the direction of airflow.

Figure 2:
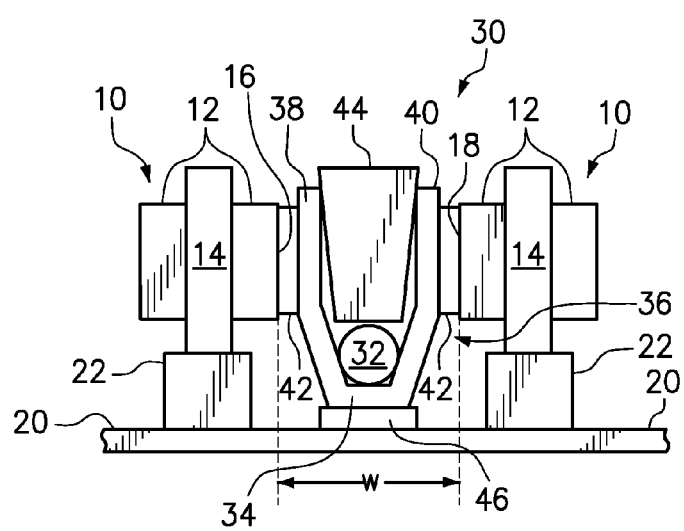
FIG. 2 is an end view of an apparatus disposed in a gap between adjacent DIMMs for cooling of the DIMMs.

FIG. 2 is an end view of an apparatus 30 disposed in the gap 26 between the surfaces 16, 18 of DRAMs 12 on adjacent DIMMs 10. The apparatus 30 includes a heat pipe 32 that is secured in the base 34 of a U-shaped structure 36 having a first thermally conductive element 38 and a second thermally conductive element 40. The first and second elements 38, 40 extend across the DRAM chips 12 that define the adjacent surfaces 16, 18, respectively. Although the first and second elements 38, 40 may contact the surfaces of the DRAM chips 12 directly, the apparatus 30 is shown including a thin interface material 42 on each element. The interface material 42 is preferably elastically compressible to form to the exact dimensions and contours of the individual DRAM chips 12 on the DIMM 10. A wedge 44 has been fully inserted between the thermally conductive elements 38, 40 to bias them outwardly against the DIMM 10. In addition, an optional thermally insulative pad 46 is shown between the base 34 and the motherboard 20. The pad 46 may be used to prevent heat loss from the heat pipe to the motherboard, such that more of the heat from the DIMMs makes it into the circulating liquid of the conduit. If the objective is solely to cool the DIMMS, then the pad is probably not needed since the heat path to the board is just one more path to cool the DIMMs and it is doubtful that temperatures would be so hot as to cause any real damage to the motherboard.

Note that the apparatus 30, including the fully inserted wedge 44, does not extend above the height of the installed DIMMs 10. This limited height may be important in various systems, such as a blade server where there is very limited space between the DIMMs and the enclosure. In a further optional aspect of the invention, the wedge 44 may extend above the height of the DIMM to indicate that the thermal interface has not been established between the apparatus and the DIMM. Still further, the wedge could extend upwardly to a height above the DIMM that is sufficient to prevent the enclosure from being closed. Accordingly, this configuration would serve as a reminder to insert the wedge downward into a latched position before closing the enclosure.

It should be understood that the heat pipe 32 is shown having a circular cross-sectional shape, but could be made having any other cross-sectional shape, such as an oval or irregular shape. Furthermore, the structure of a heat pipe is well-known to include a sealed vapor chamber that contains a volatile liquid. The outer wall of the heat pipe 32 is all that is shown in the Figures. This outer wall is typically thin-walled to maximize thermal conductivity through the outer wall to the volatile liquid contained within the vapor chamber. The volatile liquid vaporizes along hot surfaces (where thermal energy is consumed by the phase change) and condenses along cooler surfaces (where thermal energy is released by the phase change).

Although most of the foregoing description on the invention has been made in specific reference to a heat pipe, the heat pipe may optionally be substituted with another type of thermally conductive base, such as a rod, made with any material having sufficient heat transport properties so as to transfer the heat from the DIMMs to the liquid conduit. For example, low power DIMMs could be cooled with cold water in the liquid conduit and a thermally conductive base made from a solid copper bar, or other metal or composite material having a high-thermal conductivity. In embodiments that do not utilize a heat pipe, the thermally conductive base may be integrally formed with the thermally conductive elements.

Because the gap between DIMM connectors is narrow, a small heat pipe having a round cross-section may have, for example, a diameter of about 3 mm. If the heat pipe has a square cross-section, then the heat pipe cross-sectional area could be increased, for example, to fill whatever space is available between the DIMM connectors. One or more end of the heat pipe is flattened or otherwise shaped to make full contact with the liquid conduit. Optionally, a thermal conductive material, such as aluminum or copper, is wrapped around the heat pipe (and possibly soldered or brazed or joined in some manner). This assembly is inserted into the space between the DIMM connectors.

Figure 3A:
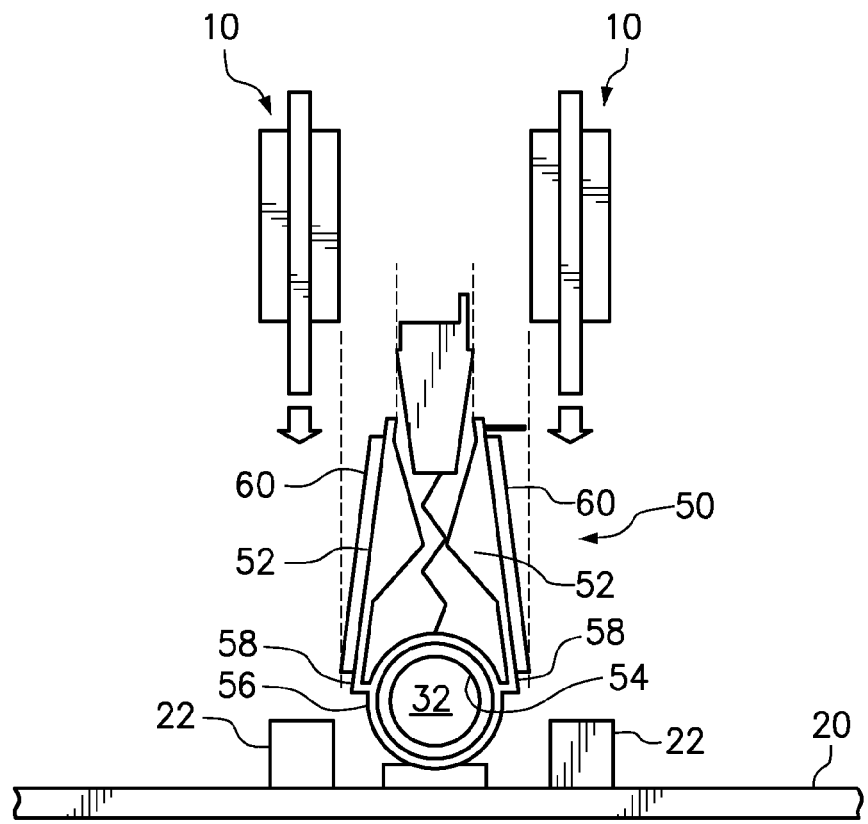
FIGS. 3A to 3C are end views showing the installation of two DIMMs into adjacent connectors and the positioning of thermally conductive elements to cool the two DIMMs.
Figure 3B:
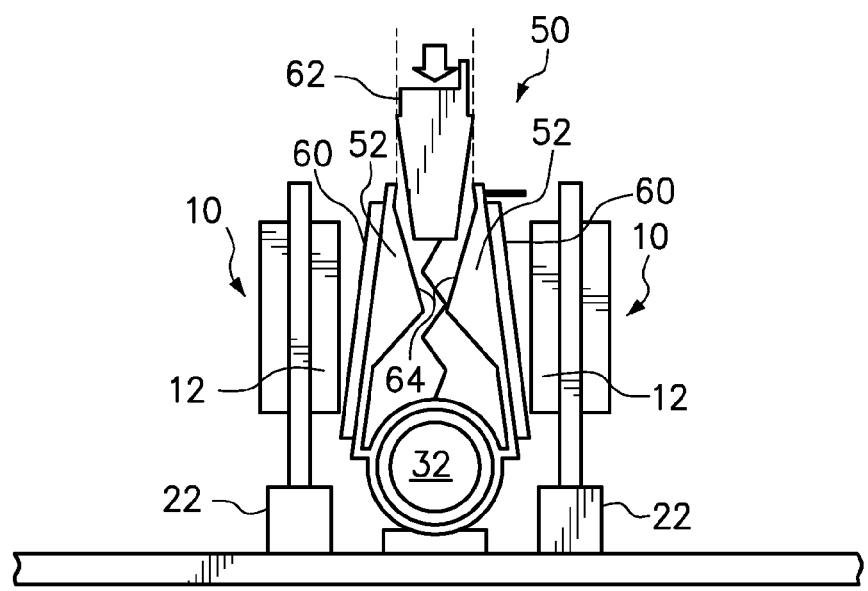
Figure 3C:
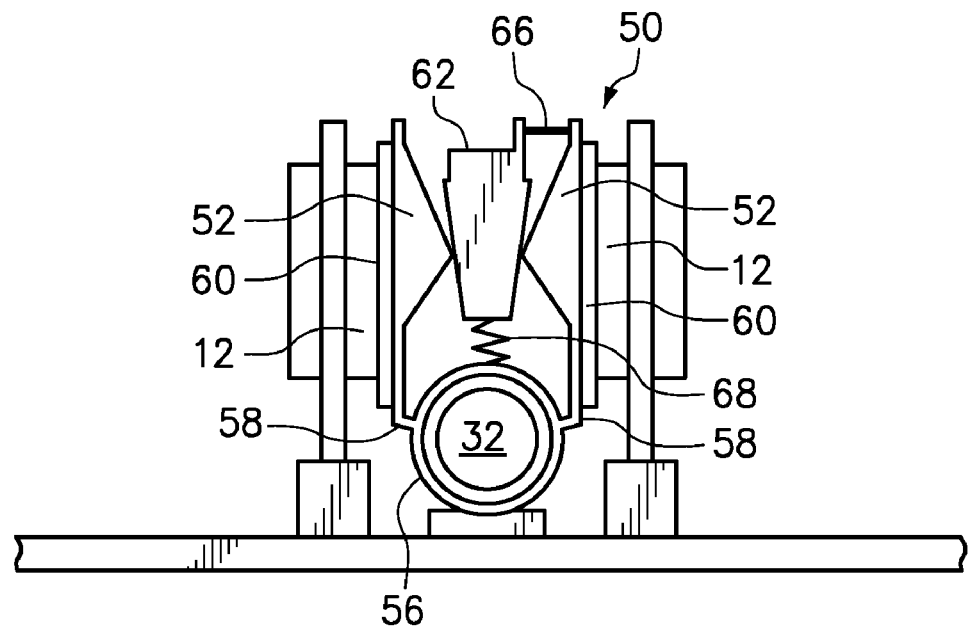

FIGS. 3A to 3C are end views showing the installation of two DIMMs 10 into adjacent connectors 22 on the motherboard 20 and the positioning of thermally conductive elements 52 to cool the two DIMMs. Referring to FIG. 3A, the apparatus 50 is similar to apparatus 30 of FIG. 2, but includes several additional features. The heat pipe 54 is disposed within a thermally conductive sleeve 56 that is coupled to, our integrally formed with, thermally conductive elements 52. Using a sleeve 56 may protect the heat pipe 54 while providing full thermal contact there between. The elements 52 each include an elbow 58 that allows each element 52 to flex relative to the sleeve 56 without any substantial bending of the portion that is directed against the DIMMs. Each element 52 also includes an elastically compressible, thermal interface material 60 that forms a generally planar, outwardly facing surface for making contact with the DIMMs.

Referring now to FIG. 3B, the DIMMs 10 have been fully installed in the respective connectors 22 without interference from the apparatus 50. The thermally conductive elements 52, including the thermal interface material 60, remains in a retracted position as in FIG. 3A. However, with the DIMMs installed, a wedge 62 may be advanced (downward) between the two elements 52 to bias the thermal interface material 60 against the adjacent DRAMs 12 on the DIMMs 10. In the embodiment of apparatus 50, each of the elements 52 have a protruding contact surface 64 that engages the inclined surfaces of the wedge 62 as it is advanced. The dimensions of the wedge 62 relative to the contact surfaces 64 will control the displacement of the elements 52 and the amount of force that the material 60 will apply against the DRAM 12.

In FIG. 3C, the wedge 62 has been fully inserted to bias the conductive elements 52, including the thermal interface material 60, to flex about the elbow 58 outwardly against the opposing DRAMs 12. The material 60 preferably makes full face-to-face contact with each DRAM 12 on the DIMM 10 despite any variation in the thickness or placement of the DRAMs. With the wedge 62 fully inserted, a latch 66 may be moved to engage the wedge and secure it in the inserted position. Various types and configurations of latches may be implemented. In addition, the fully inserted wedge 62 has compressed a spring 68, such that releasing the latch 66 will allow the spring to push the wedge outward, for example to the position shown in FIG. 3B. As seen in FIG. 3C, the apparatus 50 does not extend above the height of the DIMMs 10 when fully installed and operational. Heat generated in the DRAM chips 12 is conducted away through a path that includes the thermal interface material 60, the conductive elements 52, the sleeve 56, and the heat pipe 32. The heat pipe 32 then transfers heat, through conduction and phase changes, to a liquid conduit (shown in FIG. 5). Heat is conductively transferred from the heat pipe to the fluid conduit, then removed from the system in the circulating liquid.

Figure 4A:
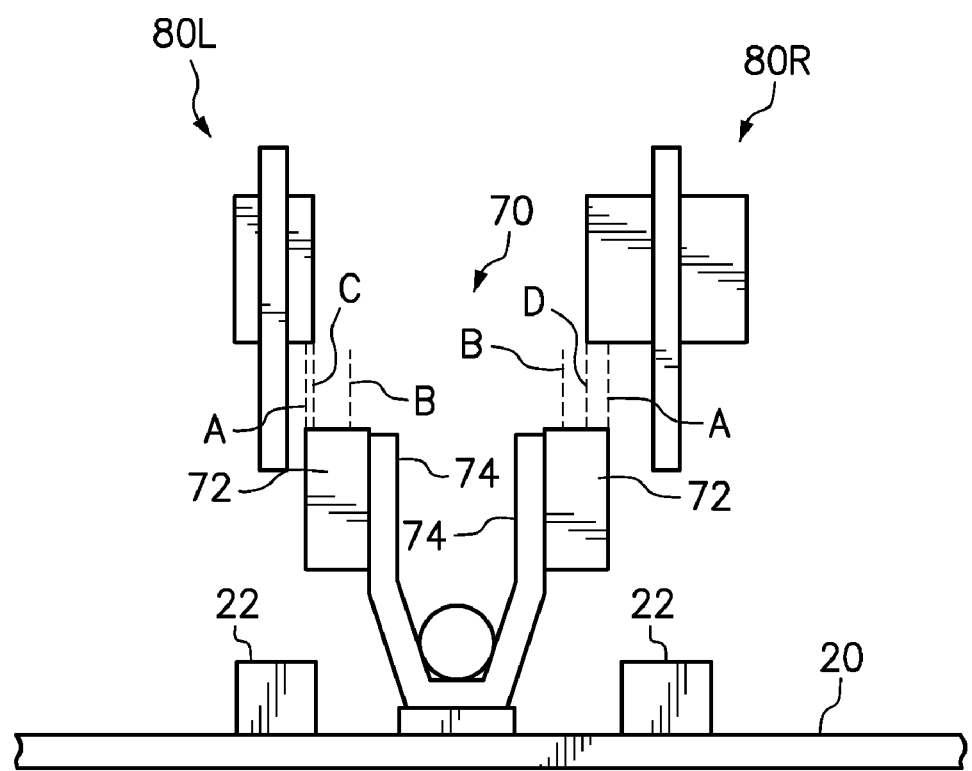
FIGS. 4A and 4B are end views of an alternative apparatus that relies upon elastically compressible thermal interface pad for extending into thermal contact with the adjacent DIMMs.
Figure 4B:
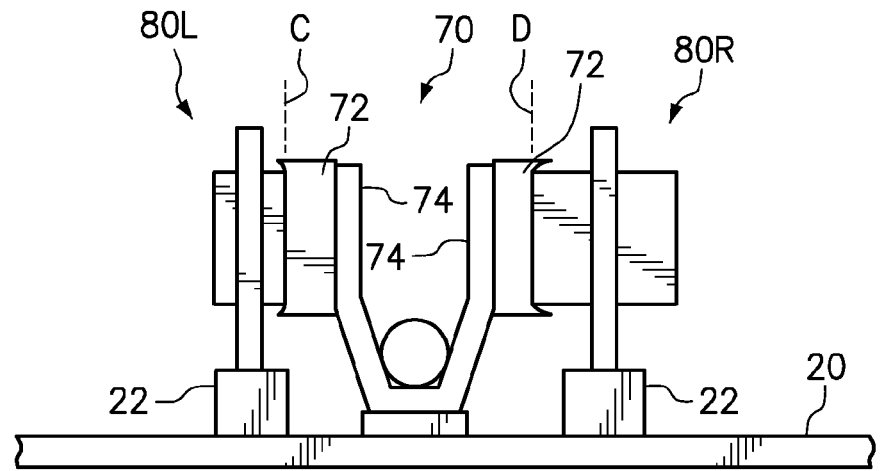

FIGS. 4A and 4B are end views of an alternative apparatus 70 that relies upon elastically compressible thermal interface pad 72 for extending into thermal contact with the adjacent DIMMs 10. The apparatus 70 may be similar in construction to the apparatus 30 of FIG. 2, except that the thermally conductive and elastically compressible thermal interface pad 72 self-biases against the DIMM rather than outwardly biasing the thermally conductive elements 74 with a wedge. The elastically compressible thermal interface pad 72 is sufficiently thick to engage the surface of a thin DIMM, yet sufficiently compressible to allow installation of a thick DIMM. For example, the elastically compressible thermal interface pad 72 make an uncompressed dimension "A" and a fully compressed dimension "B". The thermal interface pad will be able to engage any DIMM surface that is positioned between "A" and "B". In FIG. 4A, the left DIMM 80L has thin DRAM chips that establish a surface having a dimension "C" that will compress the thermal interface pad only slightly. The right DIMM 80R has thicker DRAM chips that establish a surface having a dimension "D" that will compress the thermal interface pad to about 50% of its fully compression. Accordingly, the thermal interface pad elements 72 are able to engage DIMMs having varying thickness. FIG. 4B shows the DIMMs 80L, 80R installed and the thermal interface pad elements 72 self-biased against the surface of the DIMMs. If a certain amount of force against the DIMM is required, or if a certain degree compression is required, to obtain good heat transfer, then the maximum dimension "A" may be less than the thickness of the uncompressed thermal interface pad. Furthermore, a DIMM that extends inward beyond the dimension "B" could also be accommodated by causing the elements 74 to flex inwardly.

Although the heat pipes shown in FIGS. 4A and 4B are positioned near the motherboard 20 and essentially between the connectors 22, the heat pipe 32 could also be elevated to be positioned directly between the heat-generating DRAM chips 12 to increase heat transfer.

Figure 5:
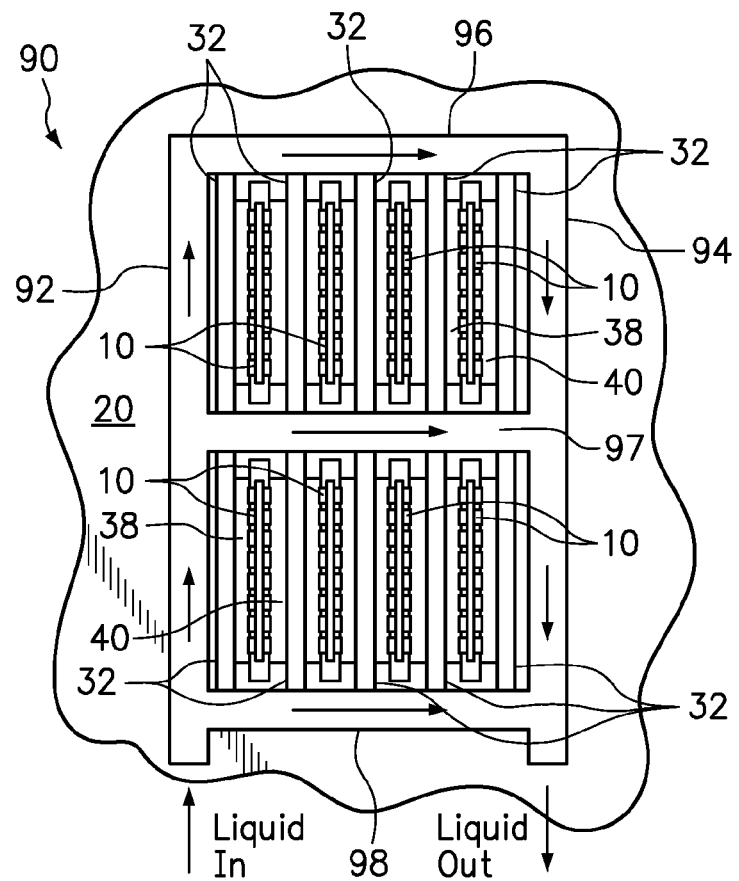
FIG. 5 is a schematic plan view of a system including a liquid conduit in thermal contact with a plurality of heat pipes that extend between adjacent DIMMs.

FIG. 5 is a schematic plan view of a system 90 including liquid conduits carrying a circulating liquid. In this embodiment, the system includes an inlet manifold 92, an outlet manifold 94, and three liquid conduits 96, 97, 98 in thermal contact with the ends of a plurality of heat pipes 32 that extend between each pair of adjacent DIMMs 10. In accordance with the system 90, each side of each DIMM is cooled through thermal contact with a thermal interface material on the thermally conductive elements 38, 40, which are on opposing sides of the heat pipes 32. The configuration of the thermally conductive elements and the thermal interface materials may follow any of the embodiments of FIGS. 2 to 4B. As previously described, heat from the DIMMs follows a path through the thermal interface material, the thermally conductive elements, and along the heat pipe to the liquid conduit. Here, liquid conduits are positioned along both ends of the DIMMS so that the heat pipe 32 may transfer heat to either end of the heat pipe. The invention also encompasses heat pipes having only one end that transfers heat to a liquid conduit.

It should be recognized that embodiments of the invention provide a flexible and modular system in which one or more DIMMs may be cooled without cooling other DIMMs, and one or more DIMMs may be removed or installed without affecting the cooling of other DIMMs. If no DIMM is installed in a connector, a dummy filler DIMM maybe installed to maintain symmetry, if required. The system is highly serviceable and is thickness-tolerant. And since the apparatus does not extend above the height of the DIMMs, it may be installed in any existing system without requiring any additional headroom. The system is suitable for the use of warm or unchilled water as the liquid circulating through the liquid conduit. Where more cooling is required, the liquid circulation rate may be increased.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
   a liquid conduit extending along at least one end of first and second adjacent DIMMs, the liquid conduit adapted for circulating a cooling liquid;
   a thermally conductive base extending along a gap between the first DIMM and the adjacent second DIMM, the base being coupled to a motherboard having an end in thermal communication with the liquid conduit;
   a first thermally conductive element extending from the base outward from the motherboard and providing thermal conduction from a surface of the first DIMM to the base; and
   a second thermally conductive element extending from the base outward from the motherboard and providing thermal conduction from a surface of the second DIMM to the base, wherein the first and second thermally conductive elements provide an adjustable span to accommodate variations in distance between the surface of the first DIMM and the surface of the second DIMM.

2. The apparatus of claim 1, further comprising:
   a wedge selectively positionable between the first and second elements to bias the first element to flex laterally into thermal communication with the first DIMM and simultaneously bias the second element to flex laterally into thermal communication with the second DIMM.

3. The apparatus of claim 2, wherein the wedge includes a latch for securing the wedge in an inserted position.

4. The apparatus of claim 2, further comprising:
   a spring disposed between first and second elements to outwardly displace the wedge from the inserted position when the latch is released.

5. The apparatus of claim 2, wherein the first and second elements each have a flat face that contacts a flat face of the first and second DIMMs when the first and second elements are in their laterally flexed position.

6. The apparatus of claim 1, wherein the thermally conductive base is a heat pipe.

7. The apparatus of claim 6, wherein the first and second elements are two legs of a U-shaped structure that receives the heat pipe therein.

8. The apparatus of claim 6, wherein the first and second elements are connected to a sleeve that is received about the heat pipe.

9. The apparatus of claim 1, wherein the first thermally conductive element includes an elastically compressible and thermally conductive interface material disposed for contact with the first DIMM, and the second thermally conductive element includes an elastically compressible and thermally conductive interface material disposed for contact with the second DIMM.

10. The apparatus of claim 9, wherein the first interface material is elastically compressible to extend between the first element and the first DIMM over a range of distances, and the second interface material is elastically compressible to extend between the first element and the first DIMM over a range of distances.

11. The apparatus of claim 1, wherein the first and second thermally conductive elements do not extend above the height of the first and second DIMMs.

12. The apparatus of claim 1, wherein the first and second DIMMs are double-sided DIMMs.

13. The apparatus of claim 6, wherein the heat pipe is a first heat pipe, and the apparatus further comprises a second heat pipe parallel to the first heat pipe and extending along the gap between first and second DIMMs, each of the first and second heat pipes having an end in thermal communication with the liquid conduit.

14. A method of cooling a DIMM, comprising:
    circulating liquid through a conduit that extends along one edge of a region containing a plurality of DIMMs; positioning a thermally conductive base between adjacent DIMMs, wherein the base is coupled to a motherboard and has an end that extends beyond the DIMMs into thermal contact with the conduit; and
    biasing first and second thermally conductive elements into thermal contact with the adjacent DIMMs, wherein the first and second thermally conductive elements extend from the base outward from the motherboard and are in thermal contact with the thermally conductive base so that heat is transferred from the adjacent DIMMs through the first and second thermally conductive element to the base, from the base to the liquid conduit, and removed with the circulating liquid.

15. The method of claim 14, wherein the liquid is unchilled water.

16. The method of claim 14, wherein the step of biasing the first and second thermally conductive elements into thermal contact with the adjacent DIMMs includes inserting a wedge between the first and second thermally conductive elements.

17. The method of claim 14, wherein the step of biasing the first and second thermally conductive elements into thermal contact with the adjacent DIMMs includes expanding a first elastically compressible and thermally conductive interface material between the first thermally conductive element and a first DIMM, and expanding a second elastically compressible and thermally conductive interface material between the second thermally conductive element and a second DIMM.

18. The method of claim 14, wherein the thermally conductive base is a heat pipe.

* * * * *